US008633858B2

(12) United States Patent
Nair et al.

(10) Patent No.: US 8,633,858 B2
(45) Date of Patent: Jan. 21, 2014

(54) METHOD OF MANUFACTURING HIGH FREQUENCY RECEIVING AND/OR TRANSMITTING DEVICES FROM LOW TEMPERATURE CO-FIRED CERAMIC MATERIALS AND DEVICES MADE THEREFROM

(75) Inventors: Deepukumar M. Nair, Cary, NC (US); Kumaran Manikantan Nair, Head of the Harbor, NY (US); Mark Frederick McCombs, Clayton, NC (US); Joao Carlos Malerbi, Westfield, IN (US); James M. Parisi, Stem, NC (US)

(73) Assignee: E I du Pont de Nemours and Company, Wilmington, DE (US)

( * ) Notice: Subject to any disclaimer, the term of this patent is extended or adjusted under 35 U.S.C. 154(b) by 423 days.

(21) Appl. No.: 13/015,254

(22) Filed: Jan. 27, 2011

(65) Prior Publication Data

US 2011/0187602 A1    Aug. 4, 2011

Related U.S. Application Data

(60) Provisional application No. 61/299,680, filed on Jan. 29, 2010.

(51) Int. Cl.
*H01Q 1/38* (2006.01)
(52) U.S. Cl.
USPC .................................. 343/700 MS; 29/600
(58) Field of Classification Search
USPC .................................. 343/700 MS; 29/600
See application file for complete search history.

(56) References Cited

U.S. PATENT DOCUMENTS

| | | | |
|---|---|---|---|
| 4,536,535 A | 8/1985 | Usala | |
| 5,757,611 A | 5/1998 | Gurkovich et al. | |
| 6,147,019 A | 11/2000 | Donohue | |
| 7,687,417 B2 * | 3/2010 | Hang et al. | |
| 8,269,671 B2 * | 9/2012 | Chen et al. | 343/700 MS |
| 8,305,255 B2 * | 11/2012 | Margomenos | 342/70 |
| 2005/0200532 A1 * | 9/2005 | Tebbe et al. | 343/700 MS |
| 2006/0052231 A1 | 3/2006 | Ito et al. | |
| 2008/0023216 A1 | 1/2008 | Hang et al. | |
| 2010/0327068 A1 * | 12/2010 | Chen et al. | 235/492 |
| 2011/0090125 A1 * | 4/2011 | Minard et al. | 343/700 MS |

FOREIGN PATENT DOCUMENTS

| | | |
|---|---|---|
| EP | 1 515 389 A1 | 3/2005 |
| EP | 1 787 963 A2 | 5/2007 |
| JP | 2004-339049 A | 12/2004 |

OTHER PUBLICATIONS

PCT International Search Report and Written Opinion mailed May 11, 2011.

* cited by examiner

*Primary Examiner* — Hoanganh Le

(57) ABSTRACT

The invention relates to methods of forming high frequency receivers, transmitters and transceivers from Low Temperature Co-fired Ceramic (LTCC) materials. Two or more layers of a low k thick film dielectric tape and in contact with each other and two or more layers of a low k thick film dielectric tape and in contact with each other form a low k high k LTCC structure with improved properties and the ability to support economical mass production techniques for high frequency transceivers. The invention also relates to the LTCC receiving, transmitting and transceiving structures and the devices made from such structures.

18 Claims, 4 Drawing Sheets

Single Substrate LTCC Transceiver –
Cross Section – Completed System

Current State of the Art Transceiver Packaging

Finished Transceiver

Single Substrate LTCC Transceiver – Cross Section

Layers of low dielectric constant (3.5 to 6.5) LTCC

Layers of higher dielectric constant (6.5 to 8) LTCC

Printed Phased Antenna Array on Low k Layers

Printed Antenna Pattern on the Top Side of Substrate

Figure 2C

Single Substrate LTCC Transceiver – Cross Section – Completed System

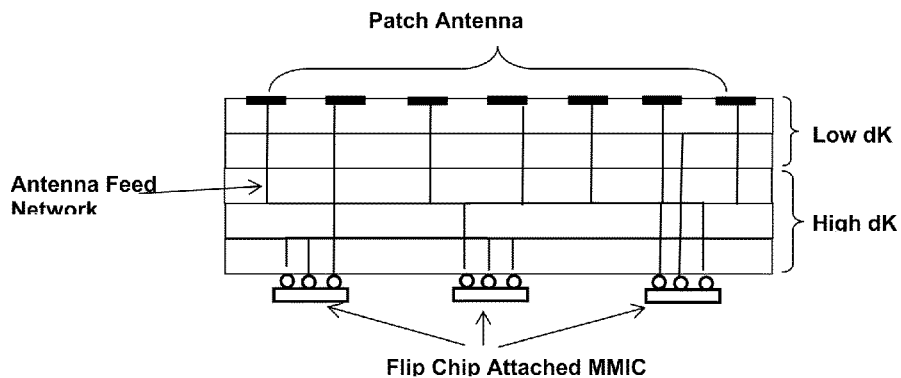

Figure 2D

Cost Comparison: State of the Art vs. Transceiver Packaging of the Invention

| 77 GHz Transceiver Packaging Cost Comparison | | |
|---|---|---|
| BOM | State of the Art | Composit 9K7/LowK LTCC |
| Antenna on Organic Substrate | $35 | $0.00 |
| Precision Machined Metal Plate | $3 | $0 |
| LTCC Antenna/ Chip Substrate | $8 | $15.00 |
| Assembly Cost | $2 | $0.50 |
| Assembly Yield | 75% | 95% |
| Total Packaging Cost | $63.33 | $16.32 |

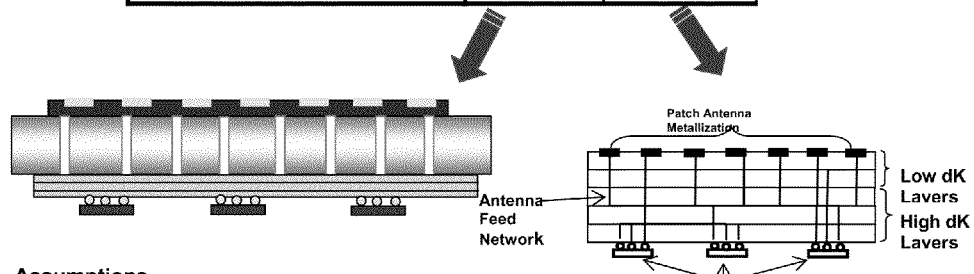

Assumptions
Antenna size : 4 in sq.
Antenna thickness : 20 mil
Chip Substrate size : 4 in sq
Chip Substrate thickness: 40 mil Variation of radiation efficiency of Microstrip printed antennas with frequency. Dielectric constant is varied as a parameter.

METHOD OF MANUFACTURING HIGH FREQUENCY RECEIVING AND/OR TRANSMITTING DEVICES FROM LOW TEMPERATURE CO-FIRED CERAMIC MATERIALS AND DEVICES MADE THEREFROM

FIELD OF THE INVENTION

The invention relates to methods of forming high frequency receivers, transmitters and transceivers from Low Temperature Co-fired Ceramic (LTCC) materials. The invention also relates to the LTCC receiving, transmitting and transceiving structures and the devices made from such structures.

TECHNICAL BACKGROUND OF THE INVENTION

Recent discoveries of (a) glasses for use in LTCC thick film materials which LTCC thick film materials achieve a sufficiently low dielectric constant (k) to allow for use as the low k portion of an electronic package for signal processing applications, and (b) such LTCC thick film materials which achieve a sufficiently low k to allow for use as the low k portion of an electronic package for signal processing applications, have created the possibility for additional discoveries utilizing such LTCC thick film materials. Such glasses are disclosed and claimed in commonly-assigned, allowed U.S. patent application Ser. No. 11/543,742, filed Oct. 5, 2006. Such low k thick film dielectric compositions are disclosed and claimed in commonly-assigned, U.S. patent application Ser. No. 11/824,116, filed Jun. 29, 2007.

An interconnect circuit board is a physical realization of electronic circuits or subsystems made from a number of extremely small circuit elements that are electrically and mechanically interconnected. It is frequently desirable to combine these diverse type electronic components in an arrangement so that they can be physically isolated and mounted adjacent to one another in a single compact package and electrically connected to each other and/or to common connections extending from the package.

Complex electronic circuits generally require that the circuit be constructed of several layers of conductors separated by insulating dielectric layers. The conductive layers are interconnected between levels by electrically conductive pathways, called vias, through a dielectric layer. Such a multilayer structure allows a circuit to be more compact.

A useful dielectric tape composition is disclosed in U.S. Pat. No. 6,147,019 to Donohue et al. The Donohue et al. dielectric tape composition achieves a dielectric constant in the range of 7-8 and is not suitable as a low k material for electronic packaging signal processing applications.

A further useful dielectric tape composition is commercially available Product No. 951 (commercially available from E.I. du Pont de Nemours and Company). This dielectric tape composition achieves a dielectric constant in the range of 7-8 and is not suitable as a low k material for electronic packaging signal processing applications.

Previously available LTCC thick film materials have not achieved a sufficiently low k to allow for use as the low k portion of an electronic package for signal processing applications. A typical use of thick film dielectric layers with a dielectric constant (k) of greater than 6 is in buried passive component applications. In these LTCC buried passive component applications, dielectric thick films are common.

However, in antenna, beamforming, filters, couplers, baluns, and other Radio Frequency (RF) signal processing applications it is preferable to use lower k materials having a k value substantially below 7-8, preferably low k materials having dielectric constants in the range of 2 to 5. Accordingly, the materials that have been used in those applications are not LTCC materials, rather they are poly-tetra-fluoro-ethylene (PTFE) materials, such as Teflon® commercially available from E.I. du Pont de Nemours and Company.

These PTFE materials can achieve a dielectric constant (k) of approximately 2.2-4. This dielectric constant of 3-4 allows for a wider line width and creates the ability to maintain 50 ohms and to achieve lower dielectric loss of the circuit and lower tolerance effects from the screen patterning the lines. Today, low k PTFE dielectrics are used in nearly all RF modules above 30 GHz due to wavelengths in the dielectric media being smaller.

The dielectric constant k is also an important material property that controls electrical performance of laminate materials. Dielectric laminate materials used in electronic industry generally fall in to two broad categories based on their dielectric constants, 1) low k materials having dielectric constants in the range of 2.2 to 5.5, and 2) high k materials with k ranging from 5.5 to 12.

Low k laminates are generally composed of complex organic materials such as the PTFE materials discussed above and high k materials are of glass-ceramic compositions.

Organic laminates may or may not have glass, ceramic, or other material particles loaded in their molecular matrix to realize different k values. LTCC materials are one of the most widely used glass ceramic material systems. Both low k and high k materials systems offer certain unique advantages owing to their dielectric constants. A comparison of specific advantages of each material group is shown in table 1.1 below.

Ceramic materials in general and LTCC materials specifically offer certain very attractive properties for electronic system level packaging, namely, (i) high mechanical strength and rigidity, (ii) hermeticity, (iii) extremely low water absorption (which is a serious issue with organic materials), (iv) excellent CTE (Coefficient of Thermal Expansion) match to industry standard semiconductor materials used in the manufacturing of integrated circuit (IC) chips.

Semiconductor materials have CTE values in the range of 3 to 5 ppm/° C., LTCC materials have CTE values close to 4.5 ppm/° C. compared to values of 17 ppm/° C. for organic materials. The close CTE match of LTCC values to that of IC chips results in very high reliability.

Furthermore, Ceramic materials in general and LTCC materials specifically (v) have smaller levels of cross talk due to higher dielectric constant. Finally, (vi) the higher dielectric constant k of LTCC materials results in very compact circuit designs.

However, the high dielectric constant k of LTCC materials makes it difficult to fabricate antennas and other radiating elements, especially at higher frequencies.

Another drawback of LTCC materials is that their higher dielectric constants k reduce signal transmission speeds.

Based on above discussion and Table 1.1 below it is clear that both low k and high k dielectric constant materials have specific advantages and disadvantages.

U.S. Pat. No. 5,757,611 to Gurkovich et al. discloses an electronic package having a buried passive component such as a capacitor therein, and a method for fabricating the same. The electronic package includes a passive component portion which includes a plurality of layers of high k dielectric material, a signal processing portion which includes a plurality of layers of low k dielectric material, and at least one buffer layer interposed between the passive component portion and the signal processing portion. Gurkovich et al. does not disclose an LTCC structure which allows for the absence of a buffer layer between the low k and high k regions. Furthermore, Gurkovich et al. discloses a method of fabrication which utilizes pressure assisted lamination. Gurkovich et al. discloses the use of passive component portions in conjunction with signal processing and does not disclose the ability for passive component portions and signal processing as stand-alone features. Additionally, Gurkovic et al. discloses the use of capture pads along all vertical vias between all layers.

Multilayer laminate structures that have both low k and high k layers have also been proposed that combine the advantages of both classes of laminate materials while limiting any adverse impact on circuit performance. However, their production methods are unwieldy and complex and the individual low k and high k components are expensive, both of which give rise to a high cost per unit manufactured. This will be described in more detail below.

The inventors have discovered that a number of circuit types could benefit from the combination of the positive aspects of both low k and high k materials in a simple, easy to manufacture LTCC laminate structure. For example, transceiver (combination of receiver and transmitter in the same circuit) circuits are a good example of such systems. Transceiver circuits are very widely used in a variety of communication equipment like cell phones, wireless network gear, radar systems, radios, etc.

A transceiver typically has a number of microwave integrated circuits (MMIC) made of semiconductors, passive components (as separate components and printed on the circuit substrate), and antennas for receiving and transmitting signals. For the packaging of electronic systems which use transceivers, the substrate material needs to be able to support attachment of MMIC, have the ability to support electrical interconnects with high routing density but lower cross talk, and be able to support efficient antenna structures.

There is a need for a simple to manufacture, inexpensive substrate material for transceivers, or other circuits such as receivers and transmitters, which combines the properties of both low k and high k materials.

The invention provides unique and novel methods and resulting structures in which two LTCC tape systems with differing dielectric constants (one with low k and the other with high k) can be combined to form a single, monolithic, multilayer circuit board for transceiver applications, or other circuits applications such as receivers and transmitters.

TABLE 1.1

Comparison of Properties of Low k and High k Materials

| Type | Advantages | Disadvantages |
| --- | --- | --- |
| High-K | Tighter confinement of fields to the substrate resulting in lower cross-talk and less unwanted radiation (EMI/EMC). Lower radiation losses Higher routing density due to closer spacing of interconnects At any given frequency, the package size reduces by approximately the square root of dielectric constant. At relatively lower frequencies (<20 GHz) this will lead to smaller package sizes | Tighter field confinement makes it impractical to fabricate antennas on high-K materials (with K > 4). This means there needs to be a hybrid solution (more than one dielectric material) for transmitters and receivers which require both chip attach layers and antennas. Leads to significant issues in processing/assembly/sourcing, and cost. Reduction in physical dimensions of packages and interconnects can impose very stringent and often impractical fabrication tolerances at millimeter wave frequencies (>40 GHz). This may also have a cost impact since costly photo-imaging patterning processes need to be used. Transmission losses can be higher for high K materials due to two reasons. 1) frequency dependent attenuation constant increases with square root of dielectric constant, 2) Narrower lines are needed for a given thickness and impedance for high-K materials leading to higher ohmic losses in conductors. Substrate needs to be thicker for a given impedance and line width for high-k materials. This will lead to larger aspect ratios for via and hence longer via resulting in higher parasitic inductance Cut-off frequency of higher order modes (which is a significant limiting factor in useable frequency band for interconnects) decreases with higher K Slower velocity of propagation for signals since velocity reduces by a factor of 1/sqrt(K). Higher dispersion leading to detrimental effects in signal integrity |
| Low-K | Possible to fabricate antennas and other radiating structures as well as function as a chip attach substrate. This means single material solution for transmitters and receivers, resulting in relatively simpler assembly and lower cost. Traces and antenna patches are larger in size at any given frequency (compared to high-K materials) resulting in less stringent fabrication tolerances. Has significant cost impact since lower cost patterning technologies can be used. | Higher cross-talk and EMI, if not designed with proper diligence. Require larger spacing between traces leading to lower routing density. However, routing density is usually not a liming factor for microwave circuits. |

TABLE 1.1-continued

Comparison of Properties of Low k and High k Materials

| Type | Advantages | Disadvantages |
| --- | --- | --- |
| | Generally low transmission loss Require thinner dielectric thickness to achieve a given impedance for a given trace width. This results in more manufacturable aspect ratios for vias and shorter via lengths (lower parasitic inductance.) Cut off frequencies for interconnects and circuits are higher leading to viable operation beyond 100 GHz. | |

SUMMARY OF THE INVENTION

The present invention provides a novel, unique and exceptionally cost effective method of mass producing a high frequency antenna having a low temperature co-fired ceramic substrate. The comprises the steps of: (a) providing one or more layers of a low k thick film dielectric tape in contact with each other, each having dielectric constant in the range of 3.5 to 6.5 and comprising, based on solids: (a) 40-80 weight percent glass composition; (b) 20-60 weight percent ceramic oxide; dispersed in a solution of (c) organic polymeric binder; to form a low k layered structure, (b) contacting said low k layered structure with a high k structure made from one or more layers of a high k material, to form an assembly having an exposed low k surface and an exposed high k surface, (c) providing a patch antenna pattern on the exposed low k surface, (d) processing the assembly to form a low temperature co-fired ceramic structure, and (e) providing chip circuitry on the exposed high k surface.

In embodiments of the invention, the high k structure is made from a high k material selected from the group consisting of alumina, aluminum nitride, silicon oxide, silicon carbide, silicon nitride, and photoimagable tape-on-substrates (PTOS) and has a k value greater than or equal to 6.5.

In other embodiments of the invention, the high k structure is one or more layers of thick film dielectric tape in contact with each other, each having a dielectric constant in the range of 6.5 to 8.

The present invention also provides novel, unique and exceptionally cost effective high frequency antenna made in accordance with the methods of the invention set forth above.

BRIEF DESCRIPTION OF THE FIGURES

FIG. 2C shows the completed single substrate LTCC transceiver of the invention in cross-section.

FIG. 2D is a comparison of the cost structure for existing devices as compared to embodiments of the invention.

DETAILED DESCRIPTION OF THE INVENTION

As a basis for describing the considerable improvement of the methods and the resultant structures and devices that are achieved by the practice of the various embodiments of the invention, the state of the art is described wherein multilayer laminate structures that have both low k and high k layers are used that combine the advantages of both classes of laminate materials while limiting any adverse impact on circuit performance. However, as will be discussed in greater detail, their production methods are unwieldy and complex and the individual low k and high k components are expensive, both of which give rise to a high cost per unit manufactured.

Because a typical transceiver needs to combine both low k and high k materials for efficient functioning, current designs use a high k ceramic material for chip attachment side of the transceiver and a low k organic material for the antenna side.

This composite structure between two entirely different types of materials (organic for low k and ceramic for high k) leads to very high levels of mismatch in properties and they cannot be attached together without an intermediate structural material.

A metal base plate made of highly polished and precision machined aluminum is currently used as the backbone of such transceiver packages.

These three components; (i) low k organic antenna substrate, (ii) high k ceramic MMIC substrate, and (iii) the metal base plate, need to be fabricated separately. Each of the three components uses an entirely different manufacturing process. They are then assembled together to form the transceiver unit.

Electrical interconnects with extremely low loss are needed between the MMIC ceramic substrate and organic antenna substrate through the metal plate. Currently, the best design solution for the interconnect structure that can be fabricated on the metal plate is an air-filled waveguide which requires extremely high geometric precision. In addition, suitable transitions need to be designed, optimized and fabricated for the interfacing between printed microstrip interconnects on laminates (both organic and ceramic) and the air-filled waveguide. Such transitions tend to be "lossy" and severely limit the loss budget of the system as a whole.

Furthermore, the assembly step needs highly specialized process equipment adding to the cost structure.

There is also a significant yield impact at the assembly stage due to the need for a high precision process to handle three different sub-components, manipulate them in space, and then to attach them together with minimum spatial misalignment to limit signal loss.

Overall, this current design solution for transceiver packaging is a highly complex, costly process resulting in higher final system cost limiting the market acceptance of systems which are built around transceivers like adaptive cruise control (ACC) systems for automobiles.

Figure 1:
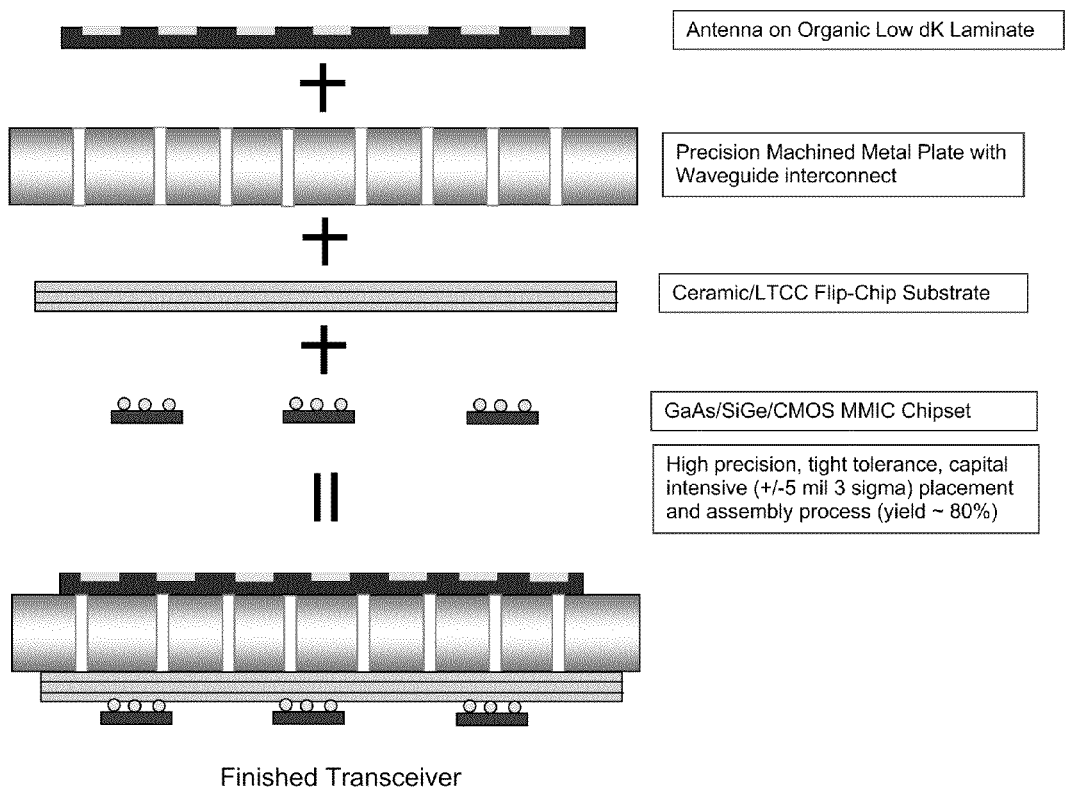
FIG. 1 depicts an example of existing transceiver packaging.

A typical example of such transceiver packaging is shown in FIG. 1.

In embodiments of the invention, the use of multiple layers of low k LTCC tape laminated together with multiple layers of high k LTCC tape and processed into a "single substrate LTCC" represents a significant advancement in the art of providing solutions for transceiver packaging. Concurrently, the numerous problems posed by state of the art as described above are either eliminated or minimized by several orders of magnitude as will be described below.

The invention utilizes the ability to engineer LTCC materials so as to have both low k and high k laminate layers in the same monolithic substrate. In embodiments of the invention, multiple layers of low k LTCC tape are laminated together with multiple layers of high k LTCC tape and processed into a single substrate LTCC. In other embodiments of the invention, antenna structures are fabricated on the low k layers while the MMIC's are mounted on the high k layers.

Because the invention provides a structure which is fully ceramic, all the advantages of ceramic materials described above in Table 1.1. Specifically, (i) high mechanical strength and rigidity, (ii) hermeticity, (iii) extremely low water absorption, (iv) excellent CTE (Coefficient of Thermal Expansion) match to (IC) chips, (v) smaller levels of cross talk due to higher dielectric constant, and (vi) very compact circuit designs are all provided by the single substrate LTCC of the present invention.

The need for separate MMIC and antenna sub-circuits is eliminated by the present invention by combining both functions in to one common substrate. Furthermore, the LTCC structure of the present invention does not require the metal base plate interposer leading to significant cost reduction. The complex assembly step which is a major cause of yield loss in the current process is completely eliminated realizing substantial savings in cost. In addition, the elimination of the assembly step reduces the cycle time and hence improves the throughput of assembly line significantly. Finally, the need for printed transmission lines (e.g., Microstrip, Coplanar Waveguide, Stripline) to air-filled waveguide transitions is eliminated thereby improving the loss budget of the system.

Because the manufacturing process used for the proposed single substrate LTCC of the invention uses only standard LTCC processes, i.e., screen printing, lamination, and firing, there is no need for any capital investment for additional specialized equipment other than what is generally needed for LTCC processing.

Figure 2A:
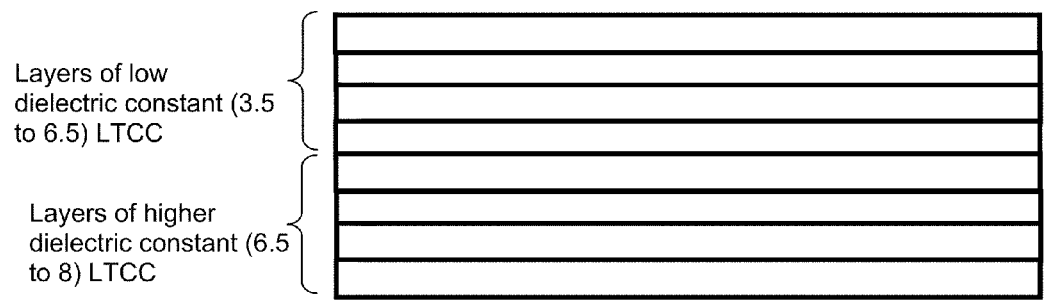
FIG. 2A shows a schematic of the transceiver package in accordance with the invention.
Figure 2B:
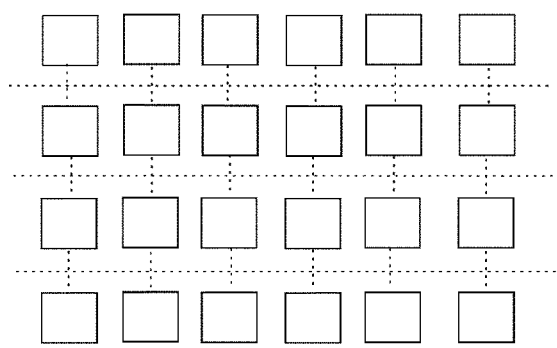
FIG. 2B shows a printed phased antenna array on low k layers.

FIG. 2A shows a schematic of the transceiver package in accordance with the invention. FIG. 2B shows a printed phased antenna array on low k layers. FIG. 2C shows the completed single substrate LTCC transceiver of the invention in cross-section. FIG. 2D is a comparison of the cost structure for the current state of the art and embodiments of the invention.

Radiation efficiency is an important operating parameter for the antenna array. Radiation efficiency specifies the ratio of electromagnetic energy that is radiated to that dissipated through various loss mechanisms. Typical loss mechanisms include resistive loss of conducting elements, dielectric loss of the substrate materials, and losses due to excitation and propagation of surface waves. Resistive loss and dielectric loss can be reduced by selecting conductors with high conductivity and substrate materials with low loss tangents. However, surface wave losses are significant and are dependent on the dielectric thickness as well as the dielectric constant of the substrate. Surface wave losses will increase with the dielectric constant of the antenna substrate for a given substrate thickness. In addition, surface waves will adversely affect the quality of radiation pattern resulting in higher side lobe level and cross polarization effects. Effect of surface wave losses become increasingly pronounced as the frequency of operation increases. Hence, it is very important to keep the dielectric constant of the antenna material relatively low. However, if the dielectric constant is too low, it will require larger metallization patterns comprising the antenna, thereby increasing the overall size of the antenna array. This in turn makes the overall system footprint exceed specifications. The composite low k/high k combination LTCC substrate of the invention achieves a very good balance between the need to keep overall circuit footprint smaller simultaneously providing relatively high radiation efficiency.

Figure 3:
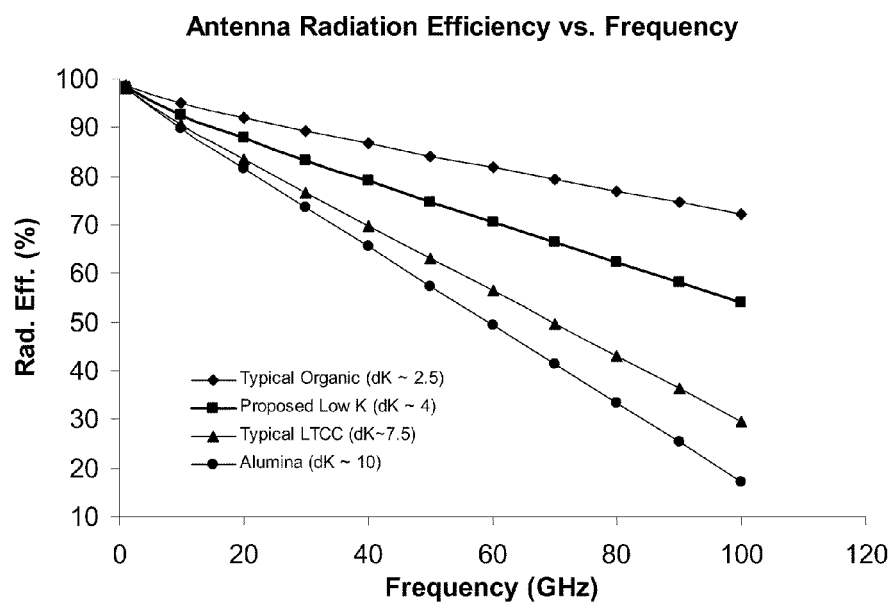
FIG. 3 shows the variation of radiation efficiency as a function of frequency for four different antenna substrate materials.

FIG. 3 shows the variation of radiation efficiency as a function of frequency for four different antenna substrate materials. For all cases the radiation efficiency decreases as frequency increases. However, the rate of decrease of radiation efficiency with frequency is the highest for material with highest dielectric constant (Alumina in this case with a dielectric constant of 10). Hence, it is clear that a lower dielectric constant for antenna substrate is advantageous in reducing the adverse effect of diminishing radiation efficiency with frequency. Moreover, the advantage of lower dielectric constant is more pronounced at higher frequencies. Table 3 below shows the absolute values of radiation efficiency at various frequency points for the materials under consideration.

TABLE 3

Antenna Radiation Efficiency as a function of frequency and dielectric constant

| | Radiation Efficiency % | | | |
|---|---|---|---|---|
| Frequency (GHz) | Organic (dK~2.5) | Low K LTCC (dK~4) | Standard LTCC (dK~7.5) | Alumina (dK~10) |
| 1 | 98.75 | 98.32 | 98.19 | 98.21 |
| 10 | 95.02 | 92.69 | 90.71 | 89.90 |
| 20 | 91.99 | 87.82 | 83.56 | 81.62 |
| 30 | 89.26 | 83.30 | 76.66 | 73.51 |
| 40 | 86.67 | 78.95 | 69.86 | 65.47 |
| 50 | 84.17 | 74.69 | 63.12 | 57.44 |
| 60 | 81.73 | 70.50 | 56.41 | 49.42 |
| 70 | 79.33 | 66.35 | 49.72 | 41.39 |
| 80 | 76.97 | 62.24 | 43.03 | 33.36 |
| 90 | 74.63 | 58.15 | 36.35 | 25.31 |
| 100 | 72.32 | 54.08 | 29.67 | 17.26 |

The low k/high k structure in accordance with the invention has low k layers with dielectric constant in the range 3.5 to 6.5, or in other embodiments, 4 to 5, that will function as the antenna substrate in a transceiver on one side. From the table it is clear that the low k/high k LTCC structure in accordance with the invention offers a significant improvement in radiation efficiency for frequencies above 30 GHz compared to other ceramic materials including both standard LTCC and alumina, owing to the presence of low k layers in the multilayer laminate LTCC structure of the invention.

Impact on antenna size is another benefit of the multilayer laminate LTCC structure of the invention. A typical transceiver array antenna is composed of a large matrix of antenna metallization patterns with each element that forms the overall matrix taking simple geometrical shapes such as rectangles or circles. Generally, the array antenna is the largest sub-system by area of the entire transceiver. Hence it is critical that the area occupied by the antenna array be kept to a minimum to keep the overall system footprint small.

The size of each of the antenna elements will depend on the dielectric constant of the antenna substrate and is inversely related to it. That means if a material with high dielectric constant is used as the antenna substrate, the resulting size of the element will be small for a given frequency of operation.

However, for better radiation efficiency the antenna substrate needs to have a lower dielectric constant. Clearly the requirements of high radiation efficiency and smaller area cannot be met simultaneously resulting in the need for an engineering compromise. So, an antenna substrate with an intermediate dielectric constant is required to guarantee good radiation efficiency with sufficiently small footprint.

As an example, Table 4 shows the area occupied by each element of a rectangular Microstrip patch array for generally used electronic packaging materials. The overall array is generally composed of 100's to 1000's of such elements adding to a large area structure.

TABLE 4

Area calculations for a single Microstrip rectangular antenna element at 75 GHz frequency.

| Material | dK | Length (mm) | Width (mm) | Area (mm2) |
| --- | --- | --- | --- | --- |
| Typical Organic (Teflon) | 2.5 | 1.11 | 1.52 | 1.6872 |
| Low K LTCC | 4 | 0.88 | 1.26 | 1.1088 |
| Standard LTCC | 7.5 | 0.63 | 0.97 | 0.6111 |
| Ceramic (Alumina) | 10 | 0.53 | 0.85 | 0.4505 |

From Table 4 it is clear that the smallest area for the antenna element is achieved for Alumina with a dielectric constant of approximately 10 and organic material results in an antenna nearly three times as big. By comparing the radiation efficiencies (Table 3) and antenna element area (Table 4), it is seen that the low k/high k LTCC structure in accordance with the invention realizes very good radiation efficiency when compared to standard LTCC with a smaller footprint, and than the organic materials, which have the highest radiation efficiency.

And so another distinct advantage of the low k/high k LTCC structure in accordance with the invention, when compared to existing designs, is that it achieves the compromise that is needed between antenna radiation efficiency and overall area of the circuit.

Impact on interconnect sizes another advantage of the low k/high k LTCC structure in accordance with the invention. One of the key functions of any dielectric substrate that is used in electronic packaging is to provide the medium to realize low loss electrical interconnects. These interconnects take the form of controlled impedance transmission lines and carry signals between various components and sub-systems, most importantly between integrated circuit chips.

Width of metallization defining interconnect is an important parameter in achieving the controlled impedance and is an inverse function of dielectric constant. For substrate materials with lower dielectric constants, interconnects need to be wider and vise versa. Hence, interconnects on low k materials will take up more space thereby making the overall footprint of the circuit very large. On the other hand, narrow controlled impedance interconnects can be readily realized on materials with higher dielectric constants. The low k/high k LTCC structure in accordance with the invention provides a distinct advantage in this regard since the chip attach side of the substrate is composed of LTCC layers with dielectric constant of the order of 6.5 to 8.0.

Accordingly, the low k/high k LTCC structure in accordance with the invention substrate offers the ability to fabricate antennas with good radiation efficiency and smaller size on the low k layers while simultaneously supporting narrow controlled impedance chip interconnects on the high k layers. This eliminates the need to have two separate substrate materials, one optimized for antenna function and the other for chip attach and interconnect, thereby simplifying the design, assembly, and manufacture of transceiver circuits significantly.

The potential to integrate buried passive components is another advantage of the low k/high k LTCC structure in accordance with the invention. Generally, transceiver circuits use a number of various types of passive components to realize various electrical functions. Resistors and capacitors are the most widely needed passive functions for transceivers. Because the low k/high k LTCC structure in accordance with the invention is a multilayer ceramic composite, it offers the ability to co-fire resistor and capacitor thick film pastes with the LTCC tape and metallizations to embed passive components within the stack up thereby freeing up valuable circuit real estate on the exterior surfaces of the substrate.

Referring to FIG. 2C, the inventive single substrate LTCC transceiver, there are no specific requirements or limits imposed by the substrate as discussed herein on the electrical interconnects between individual layers of the LTCC structure and/or the patch antenna grid and/or the MMIC device(s). Depending upon the requirements of the design and creativity of the designer there can arise any simple or complex interconnection scheme between MMIC's and between MMIC and the antenna. These interconnects can have paths made by signal traces on each substrate layer interfaces, vias connecting traces on different layers, etc. This is very much the same for any multilayer or LTCC circuits already known in the art. Irrespective of the specific nature of the interconnects, the high k layers will enable a very high interconnect or conductor density in the sense that a large number of interconnect lines can be co-located in a given area because the higher k material will allow the traces to be narrow. Simultaneously, the fabrication of the antenna can occur on the low k layers.

In embodiments of the invention there may be one or more MMIC's depending on the specific transceiver architecture a circuit designer wants to use. In other embodiments there may be transistors which are packaged very similar to the MMIC package and no MMIC's. Generally, the invention encompasses active components including MMICs and/or transistors on the low k surface of the low k/high k LTCC structure in accordance with the invention.

There are no minimum number of connections between each one of the active components including MMICs and/or transistors on the low k surface of the low k/high k LTCC structure in accordance with the invention and the patch antenna grid. Such configurations are dependent on the specific circuit design. Notwithstanding the foregoing description, there needs to be at least one interconnection between one of the active components including MMICs and/or transistors on the low k surface of the low k/high k LTCC structure in accordance with the invention and the antenna grid. In embodiments of the invention this single line connection may be "branched" to feed all the antenna grids. In other embodiments of the invention, each element of the antenna grid may have their own set of MMIC's feeding them with separate, dedicated interconnects. In a typical system design there may be on the order of 20 interconnects originating from multiple MMIC's feeding the antenna grid.

As used herein, the terms "thick film" and "thick film paste" refer to dispersions of finely divided solids in an organic medium, which are of paste consistency or tape castable slurry and have a rheology suitable for screen printing and spray, dip, ink jet or roll-coating. As used herein, the term "thick film" means a suspension of powders in screen printing vehicles or tape castable slurry, which upon processing forms a film with a thickness of several microns or greater. The powders typically comprise functional phases, glass and other additives for adhesion to the substrate, etc. The vehicles typically comprise organic resins, solvents and additives for rheological reasons. The organic media for such pastes are ordinarily comprised of liquid binder polymer and various rheological agents dissolved in a solvent, all of which are completely pyrolyzable during the firing process. Such pastes can be either resistive or conductive and, in some instances, may even be dielectric in nature. The thick film compositions of the present invention contain an inorganic binder as the functional solids are required to be sintered during firing. A more detailed discussion of suitable organic media materials can be found in U.S. Pat. No. 4,536,535 to Usala, herein incorporated by reference. In some embodiments, fired dielectric thick film layers are on the order of 3-300 microns for a single print or tape layer, and all ranges contained therein. In further embodiments, the thickness of the fired dielectric thick film layer is in the range of 3-5 microns, 5-10 microns, 10-15 microns, 30-250 microns.

I. High k Dielectric Tape Composition(s)

The present invention utilizes commercially available dielectric thick film tape compositions as a constraining tape, either externally or internally. These commercially available high k dielectric thick film tapes comprise crystallizable glass-based systems such as borate-, borosilicate, or borophospho-silicate glass networks, as used in commercially available tape Nos. 951, 943 or tapes described in U.S. patent application Ser. No. 11/543,742, herein incorporated by reference (commercially available from E.I. du Pont de Nemours and Company). These commercially available high k tapes are particularly useful in the present invention. As used herein, "high k" tapes are in the range of 6 to 8 k. The dielectric tapes noted immediately above are not standard constraining tapes. Standard constraining tapes, and will react with the functional tape layers and cannot be removed from the LTCC device, without damaging the circuits.

The high k tapes useful in the present invention are typically very reactive and would likely react with standard constraining tapes noted above, if used internally or externally; and therefore, high frequency properties such as dielectric loss and dielectric constant may degrade. Therefore, standard constraining tapes are not useful for use in conjunction with these borate-based, low loss dielectric tapes used in high frequency applications.

The present invention utilizes previously developed low k dielectric thick film compositions and methods for their use which provide (1) low dielectric loss tape for high frequency application with lower dielectric constant than the presently available k~6-8 (2) a lower shrinkage value than that presently available shrinkage value of 7-12% without using a constraining tape and (3) in some embodiments, a low k tape which provides the added property of constraining the high k dielectric tape (Commercially available Product Nos. 943, 951 and commercially available tape disclosed in U.S. patent application Ser. No. 11/543,742), and finally (4) the low k dielectric tape reacts with the high k dielectric tape and upon firing results in a continuous structure without delamination and which allows the circuit designers to incorporate several k-value tapes at appropriate locations in the z-direction of the circuits to control the functional property of the circuits at the appropriate locations. In some embodiments, upon firing the low k and high k tapes, a homogeneous structure (i.e., a structure in which the individual tape layers are indistinguishable) results.

The present invention utilizes a novel low k and low dielectric loss tape. Furthermore the low k tape described in this invention is compatible with the commercially available dielectric thick film tapes and could be used in specific layers of the LTCC structure. The novel low k tape has lower shrinkage than any commercially available functional LTCC tapes with an additional property of constraining presently available other functional green tapes (for example the high k dielectric tapes disclosed above), if used in conjunction.

Typically, a LTCC tape is formed by casting a slurry of inorganic solids, organic solids and a fugitive solvent on a removable polymeric film. The slurry consists of glass powder(s) and ceramic oxide filler materials and an organic based resin-solvent system (medium) formulated and processed to a fluid containing dispersed, suspended solids. The tape is made by coating the surface of a removable polymeric film with the slurry, so as to form a uniform thickness and width of coating.

In one embodiment, LTCC tape materials available for use as a dielectric tape layer in high frequency LTCC applications are disclosed in U.S. patent application Ser. No. 11/543,742. Furthermore, some embodiments of the dielectric thick film tape composition of U.S. patent application Ser. No. 11/543,742 are useful in the present invention as the high k thick film tape layer. This dielectric tape is designed to eliminate potentially toxic constituents and exhibits a uniform and relatively low dielectric constant in the range of 6-8. Additionally, the dielectric tape has a low dielectric loss performance over a broad range of frequency up to 90 GHz or sometimes higher depending on the metal loading.

II. Low k Thick Film Dielectric Tape Composition(s)

The low k tape has a very low shrinkage compared to commercially available "LTCC circuit functional tapes" and in addition, it constrains other commercially available tapes if used in the z-direction of the LTCC structure and does not require removal after processing. The low k tape exhibits processing and materials compatibility with conductors and passive electronic materials when used to build high density, LTCC circuits. The low k tape system or "low k tape-based composite system" with other commercially available low loss tapes provides low dielectric loss over frequencies up to 90 GHz or higher, more circuit design freedom than PTFE structures, superior X-Y constraining effect and good bonding between the low k tape and high k tape without delamination of layers under the standard processing conditions of LTCC system described in the invention. No buffer layer is required between the thick film dielectric tape layers of the present invention.

In embodiments of the invention a self constrained LTCC system is provided which allows higher integration of RF, Microwave, and/or mm wave signal processing capability into one module, package, or board. There is no LTCC or multilayer ceramic system that exists which allows use of multiple high and low k dielectric layers to be used together in one composite module, package, or board (i.e., structure) which is self constrained in the X-Y direction and which also has low k and low loss. This invention will use combinations of layers consisting of various high k and low k values, thicknesses, and loss values into one LTCC structure.

Commercially available dielectric green tapes useful for LTCC devices have a lowest dielectric constant of approximately 6-7. Circuit designers are looking for a k value that is much lower than the commercially available dielectric thick film LTCC tapes. The low K dielectrics are used in nearly all RF modules above 30 GHz. Being able to place layers of K lower than 6-8 in certain z locations in the stack-up allows more degrees of freedom for the circuit designer.

Antennas are now similar to those designed in PTFE due to the use of lower K dielectrics on the external layers of the module. Using lower K allows wider RF lines to maintain a resistance of 50 ohms. This has a two-fold impact on the designs: (1) wider lines have higher yields because the line width tolerance has a smaller effect than does a narrower line and (2) wider lines give better performance (i.e. attenuation is lower) than narrower lines.

All green tapes shrink during the LTCC processing. The shrinkage is a function of many parameters: including particle size and particle size distribution of inorganic oxide present in the tape; ratio of organic to inorganic materials; kinetics of "Un-zipping" and depolymerization of polymers and "burn-out" of carbonaceous species; kinetics of glass-softening; interaction of glass components to inorganic filler materials present in the tape, if any; nucleation and growth of crystals, if the glass is crystallizable. Even though shrinkage is a three dimensional phenomenon, the most important aspect for LTCC circuit designers is X-Y shrinkage. Preferred crystal growth has less impact on the design. However elongated crystal growth could produce surface roughness, unwanted property variations. Zero X-Y shrinkage and/or control of shrinkage to a lowest possible level is a desirable. Ceramicists have developed materials and tapes to control and constrain the LTCC tapes. These constrain tapes are based on least sinterable ceramic materials such as alumina and silica at the LTCC processing temperature. Other requirements for these constraining tapes is that it should be easily removable from the surfaces of the LTCC circuits after the sintering of the circuits; i.e., least reactive to the functional tape layers. Some constraining tapes are used internally by inserting in the Z-direction of composite layers of the functional tapes and they will become part of the circuit and will not be removed unlike tapes used to constrain externally. All the available internally constraining such tapes have high dielectric constants compared to the dielectric constant needed for high frequency applications. The LTCC tapes used in high frequency applications and described in the earlier section use borate or boro-silicate, or boro-phospho-silicate glass based system which will crystallize at the LTCC processing conditions, leaving behind a low viscosity "remnant glass". The externally constraining tapes react with the "remnant glass" so it is difficult to remove after processing without damaging the circuits, and/or leaving behind residues. Presence of such residues on the surface makes it impossible to add functional units on the surface. So an ideal solution is to develop a LTCC tape with a lower shrinkage value closer to zero or lowest acceptable shrinkage for design requirements without using a constraining tape.

Constraining the tape internally and/or externally and reducing the shrinkage of the composite to a minimum are the essential needs for the future device requirements. Standard constraining tapes cannot be used in conjunction with these tape chemistries because they react together and cannot be removed after processing, thus degrading dielectric properties: increased K, dielectric loss, and circuit surface damage if constraining tape is removed mechanically.

The present invention is also directed to a borate, boro-silicate, or a boro-phospho-silicate crystallizable glass-based tape with ceramic oxide filler components to control the crystallization of the glass, control the viscosity of the "remnant" glass, and lower the dielectric constant of the fired composite.

Furthermore, the new tape may be compatible with other, commercially available low dielectric loss tapes so that they can integrated together for several property functions.

Furthermore the tape may be incorporated into any LTCC composite system with compatable chemistry if the circuit designer so desires to incorporate specific layers of lower K and low loss dielectric properties in the circuits. Such incorporation may introduce alternations in the functional property of other tape layers in the system.

The materials are characterized by their freedom from toxic metal oxides such as oxides of lead cadmium. The materials are designed to process at about 850-875° C. useful in current tape dielectric materials. The processing conditions can be adjusted for a particular LTCC circuit. The tape is designed to cofire with conductors, buried capacitors and other passive electrical components applied by screen printing or tape casting or other similar processing conditions.

A. Ceramic Oxide(s)

The compositions described, that have small $SiO_2$ additions, have shown significant improvement in the compatibility with Ag based conductor lines. The tendency to interact in proximity to Ag conductor lines is suppressed in the tape compositions tested that were made from glasses that give high viscosity "remnant glass". The dielectric loss properties reported unexpectedly shows that the addition of small amount of $SiO_2$ in the composition do not alter significantly the dielectric characteristics of the tape dielectric. The low addition levels of $SiO_2$ addition to glass shown in this case was not reported in Donohue et al. U.S. Pat. No. 6,147,019. The addition of $SiO_2$ was indicated as not beneficial to dielectric loss.

In the present invention, significantly higher amount of silica is added as second crystalline phase filler to borate or boro-silicate or boro-phospho-silicate glasses to reduce the dielectric constant and green tape shrinkage to satisfy the low k needs of LTCC designers.

Therefore, the present invention provides a low k thick film dielectric tape composition comprising, based on wt % total inorganic composition: (1) 40-80%, preferably 45-55% borate-based or, boro-silicate, or boro-phospho-silicate-based glass composition such as glass chemistry described in U.S. Pat. No. 6,147,019; glasses disclosed and claimed in commonly-assigned, allowed U.S. patent application Ser. No. 11/543,742, filed Oct. 5, 2006; DUPONT glass used in Green Tape 951, or similar crystallizable glasses with a log viscosity range at the peak firing temperature 2-6 Poise (2) 20-60%, preferably 30-50% ceramic oxide or mixed oxide fillers such as silica, silicates compatible to glass chemistry (3) 0-5% other inorganic oxides and compounds such as copper oxide and others with similar chemistries.

B. Glass Frit

In the formulation of tape compositions, the amount of glass relative to the amount of ceramic material is important. A filler range of 20-60% by weight is considered desirable in that the sufficient densification is achieved. If the filler concentration exceeds 60% by wt., the fired structure is not sufficiently densified and is too porous. Within the desirable glass to filler ratio, it will be apparent that, during firing, the filler phase will become saturated with liquid glass. The glass-filler ratio variation is also depends on the viscosity of the glass at the softening point, viscosity of the "remnant glass", and the nature of the filler to the so-called glass "network formers"

For the purpose of obtaining higher densification of the composition upon firing, it is important that the inorganic solids have small particle sizes. In particular, substantially all of the particles should not exceed 15 um and preferably not exceed 10 um. Subject to these maximum size limitations, it is preferred that at least 50% of the particles, both glass and ceramic filler, be greater than 1 um and less than 6 um.

One embodiment of the glass composition used in this invention is a boro-phospho-silicate glass network consisting essentially of, based on mole percent, 50-56% $B_2O_3$, 0.5-5.5% $P_2O_5$, $SiO_2$ and mixtures thereof, 20-50% CaO, 2-15% $Ln_2O_3$ where Ln is selected from the group consisting of rare earth elements and mixtures thereof; 0-6% $M^I_2O$ where $M^I$ is selected from the group consisting of alkali elements; and 0-10% $Al_2O_3$, with the proviso that the composition is water millable. Another glass used in this invention has been described in Donahue and others in Hang et al.

One additional embodiment of the glass composition used in this invention is a glass composition consisting essentially of, based on mole percent, (i) 46-57.96% $B_2O_3$, (ii) a glass network former selected from the group consisting of 0.5-8.5% $P_2O_5$, 1.72-5.00% $SiO_2$, and mixtures of $P_2O_5$ and $SiO_2$ wherein the combined mole % of said mixture of $P_2O_5$ and $SiO_2$ is 3.44-8.39%, (iii) 20-50% CaO, (iv) 2-15% $Ln_2O_3$ where Ln is selected from the group consisting of rare earth elements and mixtures thereof; (v) 0-6% $MI_2O$ where MI is selected from the group consisting of alkali elements; and (vi) 0-10% $Al_2O_3$, wherein said glass composition is a ceramic-filled, devitrified glass composition, wherein said glass composition flows prior to crystallization, and with the proviso that the composition is water millable.

The inorganic filler used in this invention is silica powder has the surface area of 0.5-15.0 $m^2$/gm preferably 7.0-13.0 $m^2$/gm. Other mixed ceramic oxides and/or mixtures of ceramic oxides compatible to the wetting characteristics of the crystallizable glasses that have a log viscosity range 2-6 Poise at the maximum firing temperature of 850° C.

C. Organic Medium

The organic medium in which the glass and ceramic inorganic solids are dispersed is comprised of an organic polymeric binder which is dissolved in a volatile organic solvent and, optionally, other dissolved materials such as plasticizers, release agents, dispersing agents, stripping agents, antifoaming agents, stabilizing agents and wetting agents.

To obtain better binding efficiency, it is preferred to use at least 5% wt. polymer binder for 90% wt. solids (which includes glass and ceramic filler), based on total composition. However, it is more preferred to use no more than 30% wt. polymer binder and other low volatility modifiers such as plasticizer and a minimum of 70% inorganic solids. Within these limits, it is desirable to use the least possible amount of binder and other low volatility organic modifiers, in order to reduce the amount of organics which must be removed by pyrolysis, and to obtain better particle packing which facilitates full densification upon firing.

In the past, various polymeric materials have been employed as the binder for green tapes, e.g., poly(vinyl butyral), poly(vinyl acetate), poly(vinyl alcohol), cellulosic polymers such as methyl cellulose, ethyl cellulose, hydroxyethyl cellulose, methylhydroxyethyl cellulose, atactic polypropylene, polyethylene, silicon polymers such as poly (methyl siloxane), poly(methylphenyl siloxane), polystyrene, butadiene/styrene copolymer, polystyrene, poly(vinyl pyrollidone), polyamides, high molecular weight polyethers, copolymers of ethylene oxide and propylene oxide, polyacrylamides, and various acrylic polymers such as sodium polyacrylate, poly(lower alkyl acrylates), poly(lower alkyl methacrylates) and various copolymers and multipolymers of lower alkyl acrylates and methacrylates. Copolymers of ethyl methacrylate and methyl acrylate and terpolymers of ethyl acrylate, methyl methacrylate and methacrylic acid have been previously used as binders for slip casting materials.

U.S. Pat. No. 4,536,535 to Usala, issued Aug. 20, 1985, has disclosed an organic binder which is a mixture of compatible multipolymers of 0-100% wt. $C_{1-8}$ alkyl methacrylate, 100-0% wt. $C_{1-8}$ alkyl acrylate and 0-5% wt. ethylenically unsaturated carboxylic acid of amine. Because the above polymers can be used in minimum quantity with a maximum quantity of dielectric solids, they are preferably selected to produce the dielectric compositions of this invention. For this reason, the disclosure of the above-referred Usala application is incorporated by reference herein.

Frequently, the polymeric binder will also contain a small amount, relative to the binder polymer, of a plasticizer that serves to lower the glass transition temperature (Tg) of the binder polymer. The choice of plasticizers, of course, is determined primarily by the polymer that needs to be modified. Among the plasticizers which have been used in various binder systems are diethyl phthalate, dibutyl phthalate, dioctyl phthalate, butyl benzyl phthalate, alkyl phosphates, polyalkylene glycols, glycerol, poly(ethylene oxides), hydroxyethylated alkyl phenol, dialkyldithiophosphonate and poly (isobutylene). Of these, butyl benzyl phthalate is most frequently used in acrylic polymer systems because it can be used effectively in relatively small concentrations.

The solvent component of the casting solution is chosen so as to obtain complete dissolution of the polymer and sufficiently high volatility to enable the solvent to be evaporated from the dispersion by the application of relatively low levels of heat at atmospheric pressure. In addition, the solvent must boil well below the boiling point or the decomposition temperature of any other additives contained in the organic medium. Thus, solvents having atmospheric boiling points below 150° C. are used most frequently. Such solvents include acetone, xylene, methanol, ethanol, isopropanol, methyl ethyl ketone, ethyl acetate, 1,1,1-trichloroethane, tetrachloroethylene, amyl acetate, 2,2,4-triethyl pentanediol-1, 3-monoisobutyrate, toluene, methylene chloride and fluorocarbons. Individual solvents mentioned above may not completely dissolve the binder polymers. Yet, when blended with other solvent(s), they function satisfactorily. This is well within the skill of those in the art. A particularly preferred solvent is ethyl acetate since it avoids the use of environmentally hazardous chlorocarbons.

In addition to the solvent and polymer, a plasticizer is used to prevent tape cracking and provide wider latitude of as-coated tape handling ability such as blanking, printing, and lamination. A preferred plasticizer is BENZOFLEX® 400 manufactured by Rohm and Haas Co., which is a polypropylene glycol dibenzoate.

Application

A green tape is formed by casting a thin layer of a slurry dispersion of the glass, ceramic filler, polymeric binder and solvent(s) as described above onto a flexible substrate, heating the cast layer to remove the volatile solvent. This forms a solvent-free tape layer. The tape is then blanked into sheets or collected in a roll form. The green tape is typically used as a dielectric or insulating material for multilayer electronic circuits. A sheet of green tape is blanked with registration holes in each corner to a size somewhat larger than the actual dimensions of the circuit. To connect various layers of the multilayer circuit, via holes are formed in the green tape. This is typically done by mechanical punching. However, a sharply focused laser or other method(s) can be used to volatilize and form via holes in the green tape. Typical via hole sizes range from 0.004" to 0.25". The interconnections between layers are formed by filling the via holes with a thick film conductive ink. This ink is usually applied by standard screen printing techniques. Each layer of circuitry is completed by screen printing conductor tracks. Also, resistor inks or high dielectric constant inks can be printed on selected layer(s) to form resistive or capacitive circuit elements. Furthermore, specially formulated high dielectric constant green tapes similar to those used in the multilayer capacitor industry can be incorporated as part of the multilayer circuitry.

After each layer of the circuit is completed, the individual layers are collated and laminated. A confined uniaxial or isostatic pressing die is used to insure precise alignment between layers. The laminate assemblies are trimmed with a hot stage cutter. Firing is typically carried out in a standard thick film conveyor belt furnace or in a box furnace with a programmed heating cycle. This method will, also, allow top and/or bottom conductors to be co-fired as part of the constrained sintered structure without the need for using a conventional release tape as the top and bottom layer, and the removal, and cleaning of the release tape after firing.

The dielectric properties of the fired tape (or film) of the present invention depend on the quantity and/or quality of total crystals and glasses present and other factors. The low temperature co-fired ceramic (LTCC) device dielectric properties also depend on the conductor used. The interaction of conductor with the dielectric tape may, in some embodiments, alter the chemistry of the dielectric portion of the device. By adjusting the heating profile and/or changing the quality and/or quantity of the filler in the tape and/or chemistry of the conductor, one skilled in the art could accomplish varying dielectric constant and/or dielectric loss values.

As used herein, the term "firing" means heating the assembly in an oxidizing atmosphere such as air to a temperature, and for a time sufficient to volatilize (burn-out) all of the organic material in the layers of the assemblage to sinter any glass, metal or dielectric material in the layers and thus densify the entire assembly.

It will be recognized by those skilled in the art that in each of the laminating steps the layers must be accurate in registration so that the vias are properly connected to the appropriate conductive path of the adjacent functional layer.

The term "functional layer" refers to the printed green tape, which has conductive, resistive or capacitive functionality. Thus, as indicated above, a typical green tape layer may have printed thereon one or more resistor circuits and/or capacitors as well as conductive circuits.

It should also be recognized that in multilayer laminates having greater than 10 layers typically require that the firing cycle may exceed 20 hours to provide adequate time for organic thermal decomposition.

The use of the composition(s) of the present invention may be used in the formation of electronic articles including multilayer circuits, in general, and to form microwave and other high frequency circuit components including but not limited to: high frequency sensors, multi-mode radar modules, telecommunications components and modules, and antennas. The system described in the present invention allows higher integration of microwave functions into one module, package, or board. Other Major Significance is that no other LTCC or multilayer ceramic system that exists which allows use of multiple dielectric layers to be used together in one composite module, package, or board. This invention will use combinations of layers consisting of various K values, thicknesses, loss values into one composite structure.

Multilayer Circuit Formation

The present invention further provides a method of forming a multilayer circuit comprising the steps wherein said circuit achieves a x,y-shrinkage in the range of 0-5% and wherein said low k constraining tape layer has a k value in the range of 2-5, and wherein said tapes allow more degrees of freedom for high-frequency LTCC circuit designers to mix and match several tapes with the tapes described in this invention for specific circuit requirements.

These multilayer circuits require that the circuit be constructed of several layers of conductors separated by insulating dielectric layers. The insulating dielectric layer may be made up of one or more layers of the tape of the present invention. The conductive layers are interconnected between levels by electrically conductive pathways through a dielectric layer. Upon firing, the multilayer structure, made-up of dielectric and conductive layers, a composite is formed which allows for a functioning circuit (i.e. an electrically functional composite structure is formed). The composite as defined herein is a structural material composed of distinct parts resulting from the firing of the multilayer structure which results in an electrically functioning circuit.

What is claimed is:

1. A method of mass producing a transceiver with a high frequency antenna having a low temperature co-fired ceramic substrate, said method comprising the steps of:
   (a) providing one or more layers of a low k thick film dielectric tape in contact with each other, each having dielectric constant in the range of 3.5 to 6.5 and comprising, based on solids: (a) 40-80 weight percent glass composition; (b) 20-60 weight percent ceramic oxide; dispersed in a solution of (c) organic polymeric binder; to form an LTCC low k layered structure,
   (b) contacting said low k layered structure with an LTCC high k structure made from one or more layers of a high k material, to form an assembly having an exposed low k surface and an exposed high k surface,
   (c) providing a patch antenna pattern on the exposed low k surface,
   (d) processing the assembly to form a low temperature co-fired ceramic structure, and
   (e) providing chip circuitry on the exposed high k surface.

2. The method of claim 1 wherein said LTCC high k structure is made from a high k material selected from the group consisting of alumina, aluminum nitride, silicon oxide, silicon carbide, and silicon nitride and has a k value greater than or equal to 6.5.

3. The method of claim 1 wherein said LTCC high k structure is one or more layers of thick film dielectric tape in contact with each other, each having a dielectric constant in the range of 6.5 to 8.

4. The method of claim 1 wherein said glass composition consists essentially of, based on mole percent, 50-56% $B_2O_3$, 0.5-5.5% $P_2O_5$, $SiO_2$ and mixtures thereof, 20-50% CaO, 2-15% $Ln_2O_3$ where Ln is selected from the group consisting of rare earth elements and mixtures thereof;
   0-6% $M^I_2O$ where $M^I$ is selected from the group consisting of alkali elements; and
   0-10% $Al_2O_3$, with the proviso that the composition is water millable.

5. The method of claim 1 wherein said glass composition has a viscosity range of 2-6 Poise and said ceramic oxide is selected from the group consisting essentially of silica, silicates, and mixtures thereof, and wherein said ceramic oxide has a dielectric constant (k) in the range of 2 to 5.

6. The method of claim 1 wherein said LTCC low k thick film dielectric composition further comprises (d) up to 5 weight percent inorganic oxides selected from the group consisting of copper oxide, silicon dioxide, aluminum oxides and mixed oxides.

7. The method of claim 1, wherein the presence of lower dielectric constant layers will limit the shrinkage of the composite structure during sintering (this effect is called X-Y constraining) process.

8. The method of claim 1, further comprising including a constraining tape.

9. The method of claim 1 wherein said glass composition consisting essentially of, based on mole percent, (i) 46-57.96% $B_2O_3$, (ii) a glass network former selected from the group consisting of 0.5-8.5% $P_2O_5$, 1.72-5.00% $SiO_2$, and mixtures of $P_2O_5$ and $SiO_2$ wherein the combined mole % of said mixture of $P_2O_5$ and $SiO_2$ is 3.44-8.39%, (iii) 20-50% CaO, (iv) 2-15% $Ln_2O_3$ where Ln is selected from the group consisting of rare earth elements and mixtures thereof; (v) 0-6% $MI_2O$ where MI is selected from the group consisting of alkali elements; and (vi) 0-10% $Al_2O_3$, wherein said glass composition is a ceramic-filled, devitrified glass composition, wherein said glass composition flows prior to crystallization, and with the proviso that the composition is water millable.

10. A mass produced a transceiver with high frequency antenna having a low temperature co-fired ceramic substrate, said antenna comprising:
(a) one or more layers of a low k thick film dielectric tape in contact with each other, each having dielectric constant in the range of 3.5 to 6.5 and comprising, based on solids: (a) 40-80 weight percent glass composition; (b) 20-60 weight percent ceramic oxide; dispersed in a solution of (c) organic polymeric binder; which forms an LTCC low k layered structure,
(b) one or more layers of an LTCC high k material in contact with each other and in contact with said low k layered structure, wherein said two or more (a) layers and said two or more (b) layers form an assembly having an exposed low k surface and an exposed high k surface,
(c) a patch antenna pattern on the exposed low k surface,
(d) said assembly having been processed to form a low temperature co-fired ceramic structure, and
(e) chip circuitry on the exposed high k surface.

11. The antenna of claim 10 wherein said LTCC high k material is selected from the group consisting of alumina, aluminum nitride, silicon oxide, silicon carbide, and silicon nitride, and has a k value greater than or equal to 6.5.

12. The antenna of claim 10 wherein said LTCC high k material is one or more layers of thick film dielectric tape in contact with each other, each having a dielectric constant in the range of 6.5 to 8.

13. The antenna of claim 10 wherein said glass composition consists essentially of, based on mole percent, 50-56% $B_2O_3$, 0.5-5.5% $P_2O_5$, $SiO_2$ and mixtures thereof, 20-50% CaO, 2-15% $Ln_2O_3$ where Ln is selected from the group consisting of rare earth elements and mixtures thereof;
0-6% $M^I_2O$ where $M^I$ is selected from the group consisting of alkali elements;
and 0-10% $Al_2O_3$, with the proviso that the composition is water millable.

14. The antenna of claim 10 wherein said glass composition has a viscosity range of 2-6 Poise and said ceramic oxide is selected from the group consisting essentially of silica, silicates, and mixtures thereof, and wherein said ceramic oxide has a dielectric constant (k) in the range of 2 to 5.

15. The antenna of claim 10 wherein said low k thick film dielectric composition further comprises (d) up to 5 weight percent inorganic oxides selected from the group consisting of copper oxide, silicon dioxide, aluminum oxides and mixed oxides.

16. The antenna of claim 10, wherein the presence of lower dielectric constant layers will limit the shrinkage of the composite structure during sintering (this effect is called X-Y constraining) process.

17. The antenna of claim 10, further comprising a constraining tape.

18. The antenna of claim 10 wherein said glass composition consisting essentially of, based on mole percent, (i) 46-57.96% $B_2O_3$, (ii) a glass network former selected from the group consisting of 0.5-8.5% $P_2O_5$, 1.72-5.00% $SiO_2$, and mixtures of $P_2O_5$ and $SiO_2$ wherein the combined mole % of said mixture of $P_2O_5$ and $SiO_2$ is 3.44-8.39%, (iii) 20-50% CaO, (iv) 2-15% $Ln_2O_3$ where Ln is selected from the group consisting of rare earth elements and mixtures thereof; (v) 0-6% $MI_2O$ where MI is selected from the group consisting of alkali elements; and (vi) 0-10% $Al_2O_3$, wherein said glass composition is a ceramic-filled, devitrified glass composition, wherein said glass composition flows prior to crystallization, and with the proviso that the composition is water millable.

* * * * *